(12) United States Patent
Ohsaka et al.

(10) Patent No.: US 8,749,342 B2
(45) Date of Patent: Jun. 10, 2014

(54) METAL FOIL WITH ELECTRIC RESISTANCE FILM AND METHOD OF PRODUCING THE SAME

(75) Inventors: Shigeo Ohsaka, Saitama (JP); Toshio Kurosawa, Ibaraki (JP); Takashi Natsume, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 291 days.

(21) Appl. No.: 13/123,127

(22) PCT Filed: Oct. 13, 2009

(86) PCT No.: PCT/JP2009/067716
§ 371 (c)(1),
(2), (4) Date: May 4, 2011

(87) PCT Pub. No.: WO2010/044391
PCT Pub. Date: Apr. 22, 2010

(65) Prior Publication Data
US 2011/0236714 A1 Sep. 29, 2011

(30) Foreign Application Priority Data
Oct. 14, 2008 (JP) .................................. 2008-264759

(51) Int. Cl.
*H01C 1/012* (2006.01)

(52) U.S. Cl.
USPC ........................................................ 338/309

(58) Field of Classification Search
USPC ................................................. 338/308, 309
See application file for complete search history.

(56) References Cited

U.S. PATENT DOCUMENTS

| | | | |
|---|---|---|---|
| 5,709,957 A * | 1/1998 | Chiang et al. ................. | 428/615 |
| 6,489,034 B1 | 12/2002 | Wang et al. | |
| 6,489,035 B1 | 12/2002 | Wang et al. | |
| 6,622,374 B1 * | 9/2003 | Wang et al. ..................... | 29/620 |
| 6,771,160 B2 * | 8/2004 | Wang et al. ..................... | 338/308 |
| 2002/0047771 A1 | 4/2002 | Wang et al. | |
| 2003/0016118 A1 | 1/2003 | Schemenaur et al. | |
| 2011/0236714 A1* | 9/2011 | Ohsaka et al. ................. | 428/615 |

FOREIGN PATENT DOCUMENTS

| | | |
|---|---|---|
| EP | 1178128 A1 | 2/2002 |
| EP | 1191551 A2 | 3/2002 |
| EP | 1261241 A1 | 5/2002 |
| JP | 8-269705 A | 10/1996 |

OTHER PUBLICATIONS

Extended European Search Report, issued on Apr. 17, 2014 in counterpart EP Application No. 09820569.3.

* cited by examiner

*Primary Examiner* — James Harvey
(74) *Attorney, Agent, or Firm* — Howson & Howson LLP

(57) ABSTRACT

A copper foil with an electric resistance film in which a film with higher electrical resistivity than the metal foil is provided on the metal foil, wherein a plurality of electric resistance films with different electric resistance is arranged in parallel on the same metal foil. With conventionally used built-in resistor elements, one resistor element is configured of one type of substance on the copper foil. Nevertheless, when actually mounting the resistor elements, the circuit design tolerance can be increased and the number of man-hours can be reduced with two resistor elements and further with a plurality of resistor elements compared to a case with one resistor element. This invention aims to provide a metal foil with a built-in resistor element comprising two or more types of resistor elements on one metal foil.

10 Claims, 5 Drawing Sheets

FIG 1    PRIOR-ART
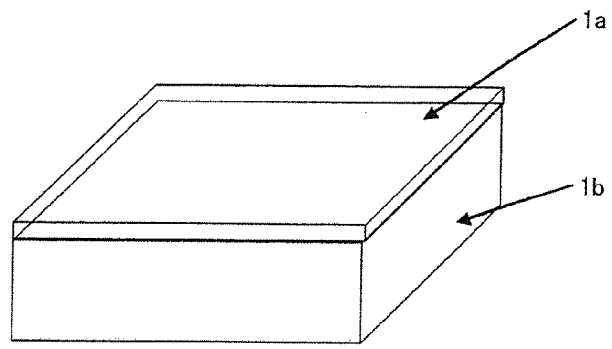
FIG 2    PRIOR-ART
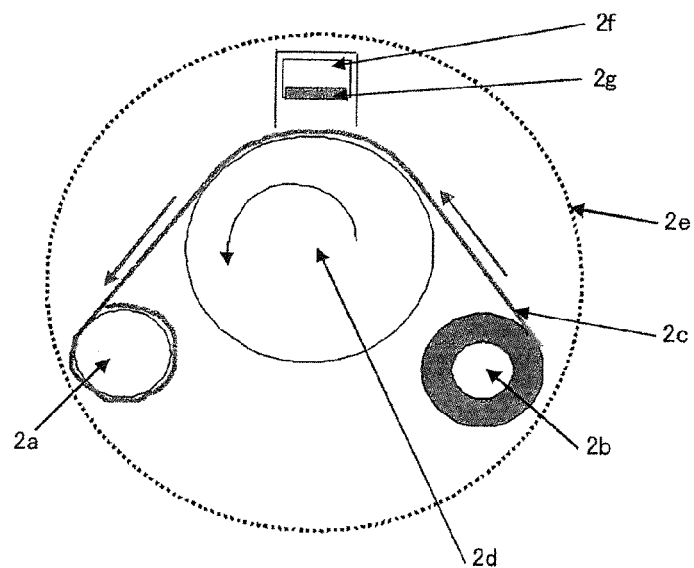

FIG 3  PRIOR-ART
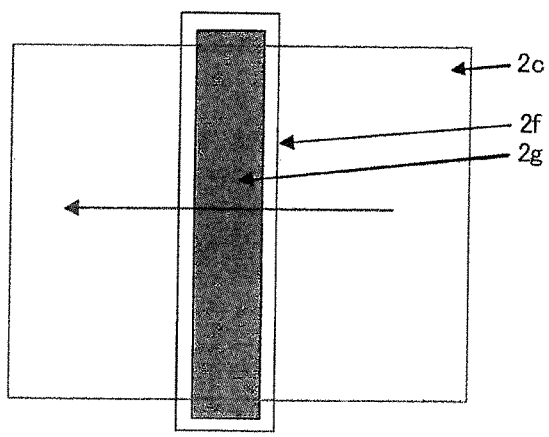
FIG 4
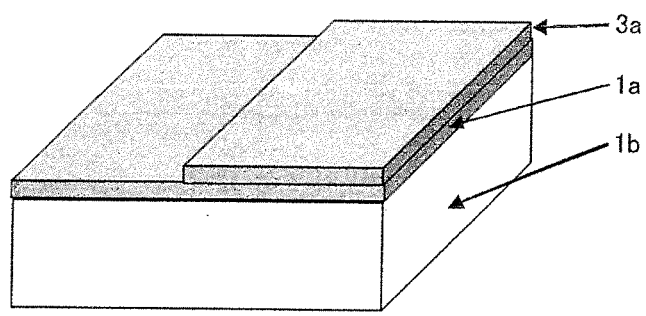

METAL FOIL WITH ELECTRIC RESISTANCE FILM AND METHOD OF PRODUCING THE SAME

BACKGROUND OF THE INVENTION

Many electronic devices are configured as a hybrid of parts with different functions. In recent years, there are demands for downsizing and weight-saving these electronic devices from the perspective of mountability, and the efficient arrangement of the respective parts corresponding to the miniaturization of the substrate area or the enlargement of the active device are being demanded. Recently, thin film resistor elements, in particular, are used upon mounting these parts. The present invention relates to a metal foil with an electric resistance film in which a film with electric resistance is formed on a metal foil.

A copper foil is generally used as the wiring material of a printed circuit board. A copper foil is classified into an electrolytic copper foil and a rolled copper foil based on the production method thereof. The thickness of the copper foil can be arbitrarily adjusted from an extremely thin copper foil with a thickness of 5 µm to a thick copper foil with a thickness of approximately 140 µm.

These copper foils are bonded to a substrate made of resin such as epoxy or polyimide, and are used as a printed circuit board. Since a copper foil is required to possess sufficient adhesive strength for adhering to the resin as the substrate, with an electrolytic copper foil, its coarse surface referred to as the matte surface which is generally formed during the production thereof is used by being additionally subject to surface roughening treatment. With a rolled copper foil, its surface is also subject to roughening treatment prior to use.

In recent years, proposals have been made for additionally forming a thin film layer made of an electric resistance material on the copper foil as the wiring material (refer to Patent Documents 1 and 2). An electric resistance element is essential in an electronic circuit board, and, if a copper foil comprising a resistive layer is used, it is only necessary to expose the resistive element of the electric resistance film layer formed on the copper foil using an etching solution such as copper chloride. Thus, as a result of building the resistor element into the substrate, the limited surface area of the substrate can be used effectively compared to conventional methods of having to mount a chip resistive element on the surface of the substrate with solder bonding.

Moreover, design restrictions can be reduced by forming a resistive element in a multi-layered substrate, and the electrical properties can be improved since the circuit length can be shortened. Thus, if a copper foil comprising a resistive layer is used, solder bonding becomes unneeded or is considerably alleviated, and weight-saving can be achieved and reliability can be improved. As described above, a substrate with a built-in electric resistance film yields numerous advantages.

Nevertheless, conventional technology stopped at forming a specific electric resistance film on the metal foil, and there was no concept of forming various types of electric resistance films on the metal foil.

[Patent Document 1] Japanese Patent No. 3311338
[Patent Document 2] Japanese Patent No. 3452557

SUMMARY OF THE INVENTION

With conventionally used built-in resistor elements, one resistor element is configured of one type of substance on the copper foil. Nevertheless, when actually mounting the resistor elements, the circuit design tolerance can be increased and the number of man-hours can be reduced with two resistor elements and further with a plurality of resistor elements compared to a case with one resistor element. Thus, an object of this invention is to provide a metal foil with a built-in resistor element comprising two or more types of resistor elements on one metal foil.

As a result of intense study to overcome the foregoing problems, the present inventors, etc. discovered that a metal foil with a built-in resistor element having two or more types of resistor elements on one metal foil is effective and can be produced relatively easily.

Based on the foregoing discovery, the present invention provides:

1) A copper foil with an electric resistance film in which a copper film with higher electrical resistivity than the metal foil is provided on the metal foil, wherein a plurality of electric resistance films with different electric resistance is arranged in parallel on the same metal foil;

A film with higher electrical resistivity as used herein represents so-called 'an electric resistance film.' It is explained as 'an electric resistance film', hereinafter.

2) The metal foil with an electric resistance film according to 1) above, wherein the plurality of electric resistance films is shaped the same and respectively configured from a resistor element with different electrical resistivity;

3) The metal foil with an electric resistance film according to 1) above, wherein the plurality of electric resistance films is respectively configured from a resistor element with a different cross-section shape;

A cross-section shape as used herein represents 'thickness' and 'width.' Electric resistance changes depending on thickness and width even with materials that have the same specific resistance. Accordingly, the present invention includes the change of electric resistance by way of changing 'thickness' and 'width,' namely, a cross-section shape.

4) The metal foil with an electric resistance film according to 1) above, wherein the plurality of electric resistance films is respectively configured from a combination of a resistor element with different electrical resistivity and a resistor element with a different cross-section shape;

5) The metal foil with an electric resistance film according to any one of 1) to 4) above, wherein the plurality of electric resistance films is configured by being mounted with different resistor elements in a length direction of the metal foil;

6) The metal foil with an electric resistance film according to any one of 1) to 4) above, wherein the plurality of electric resistance films is configured by being mounted with different resistor elements in a direction that transects the length direction of the metal foil; and 7) The metal foil with an electric resistance film according to any one of 1) to 6) above, wherein metal of the metal foil is copper or copper alloy.

The present invention additionally provides:

8) A method of producing a metal foil with an electric resistance film of disposing a cathode made of an electric resistance material in a vacuum device, sputtering the cathode as the target while carrying the metal foil in a manner of facing the cathode, and depositing a target material on the metal foil, wherein at least two or more cathodes are arranged opposite to the metal foil, and a plurality of electric resistance films with different electric resistance is deposited on the same metal foil;

9) A method of producing a metal foil with an electric resistance film of disposing a cathode made of an electric resistance material in a vacuum device, sputtering the cathode as the target while carrying the metal foil in a manner of facing the cathode, and depositing a target material on the metal foil, wherein a plurality of electric resistance films with different electric resistance is deposited on the same metal foil by setting a shutter between the target and the metal foil and controlling the film thickness with the shutter; and 10) The method of producing a metal foil with an electric resistance film according to 8) or 9) above, wherein the metal foil is a copper foil or a copper alloy foil.

As a result of using the copper foil with two or more types of built-in electric resistance film layers of the present invention, it is no longer necessary to independently form a separate electric resistance element upon designing the circuit, and, since it is only necessary to expose the resistive element of the electric resistance film layer formed on the copper foil using an etching solution such as copper chloride, solder bonding becomes unneeded or is considerably alleviated, and an effect is yielded in that the mounting process is significantly simplified.

Moreover, as a result of the number of parts to be mounted or soldered being reduced, there is also an advantage in that the space can be expanded and downsizing/weight-saving can be achieved. It is thereby possible to improve the freedom of circuit design. In addition, as a result of two or more types of resistor elements being built into the copper foil, an additional effect is yielded in that signal properties are improved in the high frequency region.

BRIEF DESCRIPTION OF THE DRAWINGS

FIG. 1 is an explanatory diagram showing the structure of a conventional metal foil with a resistive layer.

FIG. 2 is an explanatory diagram showing a production example of a conventional metal foil with a resistive layer.

FIG. 3 is a plan view showing the positional relationship of the target and the copper foil upon producing a conventional metal foil with a resistive layer.

FIG. 4 is an explanatory diagram showing an example of the structure of the metal foil with a resistive layer of the present invention in which two types of built-in resistor elements are formed on the copper foil.

DETAILED DESCRIPTION OF THE INVENTION

Figure 5:
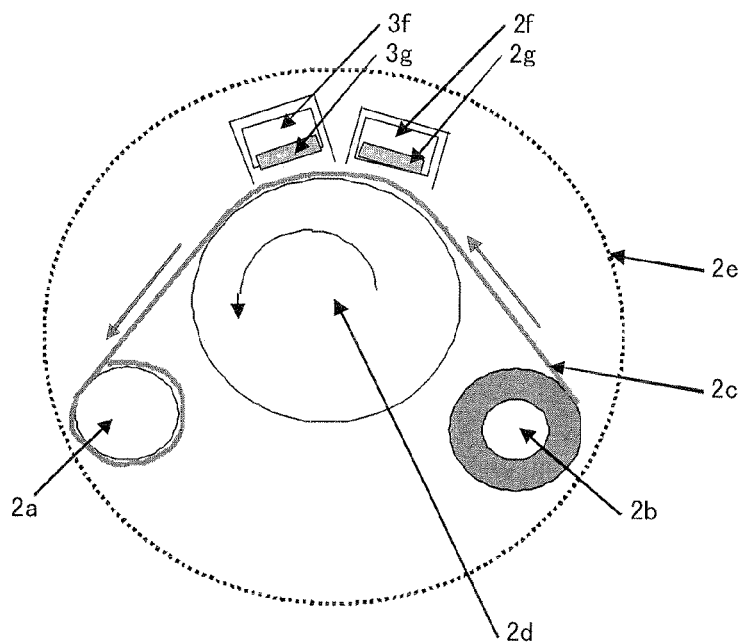
FIG. 5 is an explanatory diagram showing a production example of the metal foil with a resistive layer of the present invention.

The structure of a conventional copper foil with a built-in resistor element is shown in FIG. 1. Reference numeral 1a is the built-in thin film resistor element, and reference numeral 1b is the base copper foil. The thin film resistor element 1a is made of NiCr or the like, and is formed based on a manufacturing method of performing sputtering to the surface of the copper foil while winding the copper foil.

FIG. 2 and FIG. 3 are explanatory diagrams showing the production example of a conventional copper foil with a built-in resistor element. In FIG. 2, the copper foil 2c wound around a rewind roller 2b is wound with a winding roller 2a via a rotating cooling drum 2d.

Argon gas is introduced into a vacuum chamber 2e and the pressure is retained at approximately 0.4 pa. Subsequently, when high voltage is applied to a cathode 2f, a plasma state is realized and the target material 2g is discharged and sputtered on the copper foil.

FIG. 3 is a plan view showing the positional relationship of the target and the copper foil, wherein 2f is the cathode, 2g is the target, 2c is the copper foil, and the arrow shows the winding direction of the copper foil.

FIG. 4 is an embodiment of the present invention. 1b is the base copper foil, and 1a and 3a are resistor elements which are made from NiCr, for example. Addition of 3a is the basic structure of the present invention.

In the example of FIG. 4, if 1a and 3a are configured from NiCr as the same resistor element, two types of built-in resistor elements with a different thickness can be obtained.

When preparing resistor elements with two types of sheet resistance values of 50 $\Omega/cm^2$ and 100 $\Omega/cm^2$, for example, 1a is made to have a film thickness of 200 Å and 3a is made to have a film thickness of 100 Å.

Figure 6:
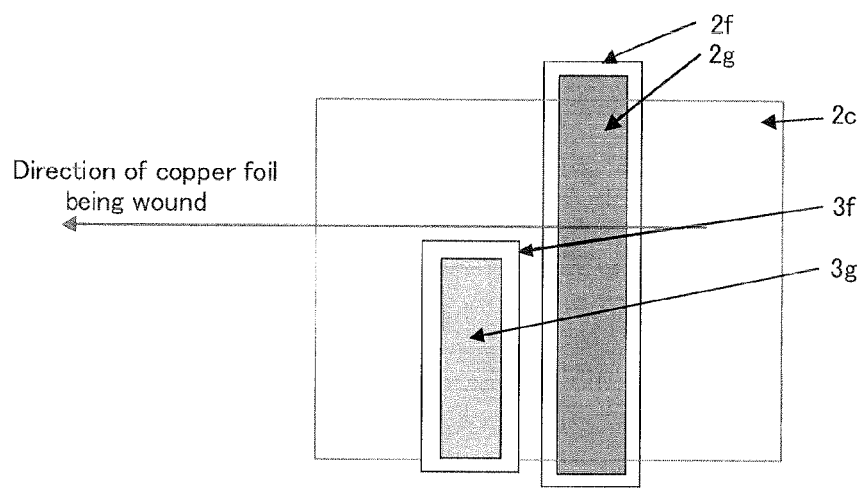
FIG. 6 is a plan view showing the positional relationship of the target and the copper foil upon producing the metal foil with a resistive layer of the present invention.

FIG. 5 and FIG. 6 are explanatory diagrams showing the production example of the copper foil with a built-in resistor element of the present invention. In FIG. 5, the copper foil 2c wound around the rewind roller 2b is wound with the winding roller 2a via the rotating cooling drum 2d.

FIG. 5 is a configuration of adding the second cathode 3f to the conventional method shown in FIG. 1, and FIG. 6 is a plan view showing the positional relationship thereof. The first cathode and the second cathode are simultaneously operated and sputtering is performed to the copper foil while winding the copper foil. A copper foil with a built-in resistor element of the structure shown in FIG. 4 is thereby obtained.

Two types of resistor elements can be manufactured with an arbitrary width by changing the length of the first and second cathodes. If third and fourth cathodes are further added, multiple types of resistor elements can be built into one copper foil.

Figure 7:
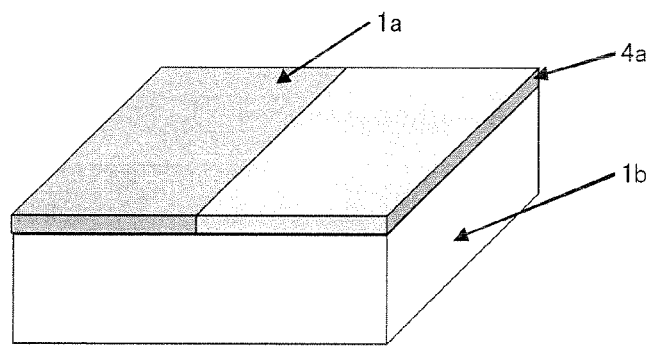
FIG. 7 shows another example of the present invention, and shows the structure where two types of resistive layers are formed so that they do not overlap with each other.

FIG. 7 shows another embodiment. 1a is a NiCr resistor element, 1b is a copper foil, and 4a is a separate resistor element made of CrSiO, for example. In this embodiment, the difference of the two built-in resistor elements can be increased, since two types of resistor elements are made from different substances.

If the NiCr thickness is sputtered to 300 Å and the CrSiO thickness is sputtered to 500 Å, for example, the result will be 50 $\Omega/cm^2$ and 400 $\Omega/cm^2$, and two types of considerably different built-in resistor elements can be formed.

Although the production method is the same as the method shown with reference to in FIG. 5 and FIG. 6, for example, if the target 3g shown in FIG. 5 and FIG. 6 is formed with CrSiO and the cathode 2f is shortened and arranged so that it will not overlap, and sputtering is performed thereto, the structure of FIG. 7 is obtained.

Figure 8:
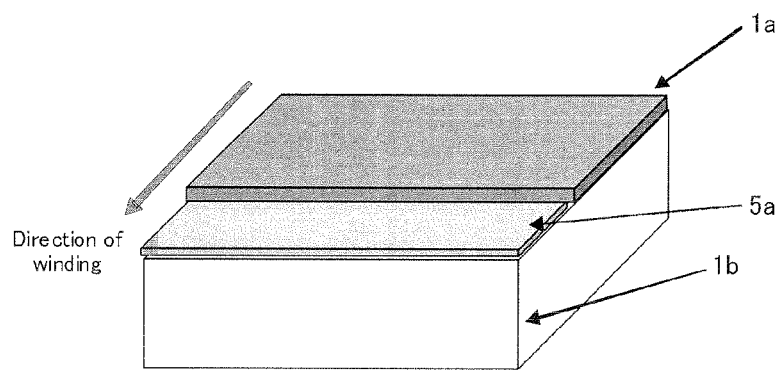
FIG. 8 shows a structure of the copper foil with built-in resistor elements having different resistance in the winding direction, and shows an example of producing different resistor elements by changing the thickness of the same resistor element.

FIG. 8 is yet another embodiment, and shows the structure of a copper foil with built-in resistor elements having different resistance in the winding direction. FIG. 8 shows a method of producing different resistor elements by changing the thickness of the same resistor element. In FIG. 8, 1b is the base copper foil, 1a is a NiCr resistor element, for example, and 5a is a NiCr resistor element with a decreased thickness, for example, and the resistance will increase as a result of the thinning.

Figure 9:
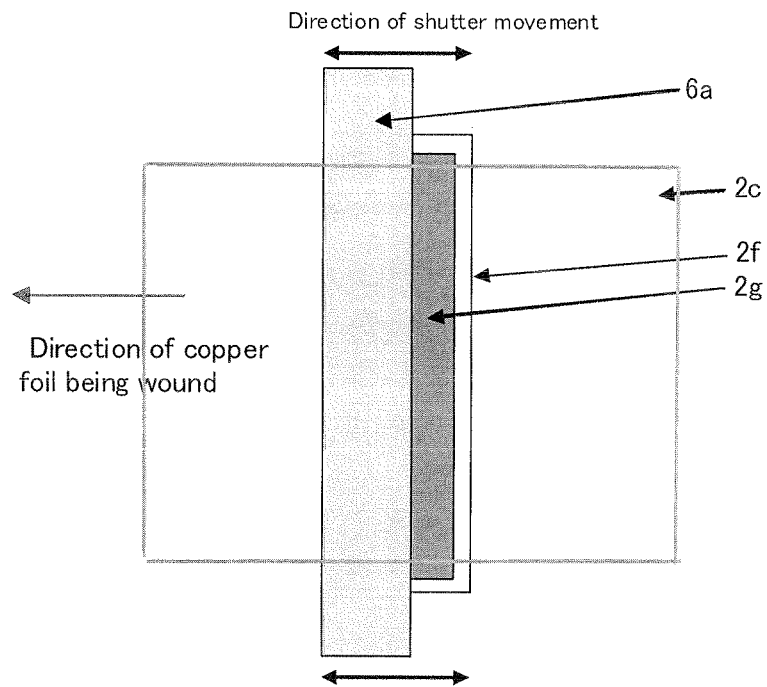
FIG. 9 is an explanatory diagram showing an example of providing a shutter between the copper foil and the target and mechanically moving the shutter in order to cause the thickness of the resistive layer to be variable.

The method of producing the resistor element of FIG. 8 is shown in FIG. 9. FIG. 9 is a plan view showing the positional relationship of the cathode 2f, the copper foil 2c, and the shutter 6a.

Figure 10:
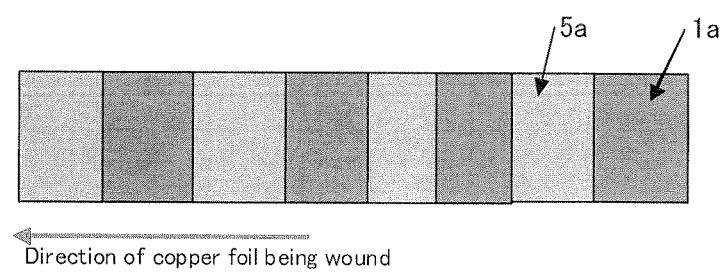
FIG. 10 is an explanatory diagram showing an example of alternately producing the resistive layers 1a and 5a with a different thickness.

With an actual device, the shutter 6a in FIG. 9 is able to move mechanically so as to cover the target 2g. Thus, as a result of moving the shutter at a fast speed, a partially thin resistor element as shown with 5a of FIG. 8 can be prepared at an arbitrary location. FIG. 10 shows an embodiment of alternately producing 1a and 5a.

Thus, the present invention provides a metal foil with two or more types of built-in thin film resistor elements, and the metal foil with two or more types of built-in resistor elements can be decided arbitrarily according to the circuit design.

Specifically, the type of electric resistance material and the film thickness and shape of the resistance film are decided in consideration of the function of the resistive element, and there is no particular limitation.

As examples of materials used as the electric resistance element; for instance, there are materials such as vanadium, tungsten, zirconium, molybdenum, tantalum, nickel, and chromium. So as long as it is a metal with relatively high electric resistance, these metals can be respectively used as an independent film, or as an alloy film with other elements.

Moreover, even materials with a relatively low electric resistance such as aluminum, silicon, copper, iron, indium, zinc and tin can be alloyed with other elements and used if the resulting material has high electric resistance.

For example, electric resistance elements such as NiCr alloy and NiCrAlSi alloy are materials that are attracting attention. Moreover, oxides, nitrides and silicides selected from the oxides, nitrides and silicides of the foregoing elements can be used. As described above, the selection of these materials is made arbitrarily according to the circuit design, and it should be understood that there is no limitation to the foregoing materials.

Upon forming this electric resistance film layer, physical surface treatment methods such as the sputtering method, vacuum deposition method and the ion beam plating method; chemical surface treatment methods such as the pyrolysis method and the gas-phase reaction method; or a wet-type surface treatment method such as electroplating and electroless plating can be used.

Generally speaking, electroplating is advantageous for the production at low cost. Moreover, the sputtering method is advantageous in that a high-quality resistive element can be obtained since the film has a uniform thickness and comprises isotropy.

The formation of the electric resistance film layer is made according to the usage of the film, and the adhesion method and plating method in such a case are desirably selected suitably according to the nature of the electric resistance film layer.

As the metal foil comprising the resistance film layer of the present invention, a copper foil is the representative material. Generally speaking, a copper foil with a foil thickness of 5 to 70 μm, and particularly a copper foil with a foil thickness of 5 to 35 μm can be used. The thickness of the copper foil can be arbitrarily selected according to the usage, but there are limitations based on the manufacturing conditions, and it is efficient to produce the copper foil within the foregoing range. In addition, with the present invention, an electric resistance layer can also be formed on the surface of the electrolytic copper foil or the rolled copper foil to which roughening treatment was performed. And, it is also possible to perform roughening treatment of adhering knobby particles on the matte surface of the electrolytic copper foil.

Moreover, it is also possible to perform roughening treatment to the rolled copper foil as needed. Based on the foregoing roughening treatment, a roughened surface of a low profile copper foil or a standard profile copper foil of Rz 0.3 to 10.0 μm can be obtained. The present invention can built two or more types of electric resistance film layer into these metal foils.

As a result of using the metal foil with two or more types of built-in electric resistance film layers of the present invention, it is no longer necessary to independently form a separate electric resistance element upon designing the circuit, and, since it is only necessary to expose the resistive element of the electric resistance film layer formed on the copper foil using an etching solution such as copper chloride, solder bonding becomes unneeded or is considerably alleviated, and an effect is yielded in that the mounting process is significantly simplified. Moreover, there is an additional effect in that a copper foil with a built-in resistor element comprising several types of resistor elements can be realized with a single production.

Moreover, as a result of the number of parts to be mounted or soldered being reduced, there is also an advantage in that the space can be expanded and downsizing/weight-saving can be achieved. It is thereby possible to improve the freedom of circuit design. In addition, as a result of two or more types of resistor elements being built into the copper foil, a superior effect is yielded in that the freedom of design can be expanded in terms of the mountability of electronic parts with one copper foil with a built-in resistor element, and the present invention is extremely effective as a printed circuit board.

The invention claimed is:

1. A metal foil with an electric resistance film in which a film with higher electric resistance than the metal foil is provided on the metal foil, wherein a plurality of electric resistance films with different electric resistance is mounted in a direction that transects a length direction of the metal foil.

2. The metal foil with an electric resistance film according to claim 1, wherein each of said electric resistance films of said plurality of electric resistance films is shaped substantially the same and is respectively configured from a resistor element of different electric resistance.

3. The metal foil with an electric resistance film according to claim 2, wherein the metal foil is a copper or copper alloy foil.

4. The metal foil with an electric resistance film according to claim 1, wherein said plurality of electric resistance films is configured from a combination of resistor elements of different cross-sectional shape.

5. The metal foil with an electric resistance film according to claim 4, wherein the metal foil is a copper or copper alloy foil.

6. The metal foil with an electric resistance film according to claim 1, wherein the plurality of electric resistance films is configured from a combination of a resistor element having different electrical resistivity and a resistor element of a different cross-sectional shape.

7. The metal foil with an electric resistance film according to claim 1, wherein metal of the metal foil is copper or copper alloy.

8. The metal foil with an electric resistance film according to claim 6, wherein the metal foil is a copper or copper alloy foil.

9. A method of producing a metal foil with an electric resistance film, comprising the steps of disposing a cathode made of an electric resistance material in a vacuum device, sputtering the cathode as the target while carrying the metal foil in a manner of facing the cathode, and depositing a target material on the metal foil, wherein a plurality of electric resistance films with different electric resistance is deposited on the same metal foil by arranging a shutter between the target and the metal foil and controlling film thickness with the shutter.

10. The method of producing a metal foil with an electric resistance film according to claim 9, wherein the metal foil is a copper foil or a copper alloy foil.

* * * * *